(12) United States Patent
Kise et al.

(10) Patent No.: US 7,003,013 B2
(45) Date of Patent: Feb. 21, 2006

(54) DISTRIBUTED FEEDBACK SEMICONDUCTOR LASER DEVICE

(75) Inventors: Tomofumi Kise, Tokyo (JP); Masaki Funabashi, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 73 days.

(21) Appl. No.: 10/310,939

(22) Filed: Dec. 6, 2002

(65) Prior Publication Data

US 2003/0138016 A1 Jul. 24, 2003

(30) Foreign Application Priority Data

Dec. 7, 2001 (JP) ............................ 2001-374281
Aug. 7, 2002 (JP) ............................ 2002-229894

(51) Int. Cl.
*H01S 3/08* (2006.01)

(52) U.S. Cl. ................. 372/96; 372/46.01; 372/46.015

(58) Field of Classification Search .................. 372/96, 372/45–46, 46.01, 46.015, 46.016
See application file for complete search history.

(56) References Cited

U.S. PATENT DOCUMENTS

| | | | | |
|---|---|---|---|---|
| 4,935,936 A | * | 6/1990 | Nelson et al. ................. 372/46 |
| 5,306,923 A | * | 4/1994 | Kazmierski et al. ........... 257/14 |
| 5,666,455 A | * | 9/1997 | Aoki et al. .................. 385/131 |
| 5,721,751 A | * | 2/1998 | Itaya et al. ................... 372/46 |
| 5,821,570 A | * | 10/1998 | Kazmierski et al. .......... 257/97 |
| 6,674,784 B1 | * | 1/2004 | Takiguchi et al. ............ 372/96 |

* cited by examiner

Primary Examiner—James Menefee
(74) Attorney, Agent, or Firm—Oblon, Spivak, McClelland, Maier & Neustadt, P.C.

(57) ABSTRACT

A DFB semiconductor laser device including an n-type semiconductor substrate and a layer structure, overlying the semiconductor substrate, including an active layer, a compound semiconductor layer constituting a diffraction grating and overlying the active layer, and an embedding layer embedding the diffraction grating, wherein said at least one of the compound semiconductor layer and the embedding layer has a carrier density of $7 \times 10^{17}$ to $2 \times 10^{18}$ cm$^{-3}$.

8 Claims, 8 Drawing Sheets

DISTRIBUTED FEEDBACK SEMICONDUCTOR LASER DEVICE

BACKGROUND OF THE INVENTION (a) Field of the Invention

The present invention relates to a distributed feedback semiconductor laser device, and more in particular to the distributed feedback semiconductor laser device including, on an n-type semiconductor substrate, a layer stack having a smaller threshold current, higher initial slope efficiency and lower device resistance.

(b) Description of the Related Art

A wavelength division multiplexing (WDM) optical transmission system attracts public attention because the system can significantly increase the optical communication capacity by transmitting a plurality of optical signals having different wavelengths through a single optical fiber.

As the optical source of the WDM optical transmission system, a distributed feedback semiconductor laser device (hereinafter also referred to as "DFB laser") having an excellent operatability at a single wavelength is generally used.

In an uncooled DFB, the temperature control of the device or the cooling of the DFB laser with a device cooling component is not conducted laser for reducing the fabrication cost. The uncooled DFB laser can be directly modulated and used for the relatively shorter distance transmission such as for the urban main line and subscribers. The uncooled DFB laser does not include the Peltier cooled device that is usually mounted as the device cooling component.

The uncooled DFB laser is required to operate in the circumstance of which temperature is uncontrolled or to continuously operate in a wider temperature range such as from −40° C. to +85° C., and to decrease its device resistance as low as possible for suppressing heat generation due to the current injection.

The DFB laser includes a structure in which the real part and the imaginary part of a refractive index in a resonator (hereinafter referred to as "diffraction grating") are periodically changed to feedback light having a specified wavelength, thereby producing wavelength selectivity.

A lasing wavelength $\lambda_{DFB}$ can be established independently from a gain peak wavelength $\lambda_{PL}$ of the active layer and is defined to be $\lambda_{DFB}=2\cdot\Lambda\cdot n_{\mathit{eff}}$, wherein $\Lambda$ is a cycle of the diffraction grating and $n_{\mathit{eff}}$ is an equivalent refractive index of a waveguide. The gain peak wavelength $\lambda_{PL}$ of the active layer corresponds to a peak photoluminescence wavelength.

The difference between the gain peak wavelength $\lambda_{PL}$ and the lasing wavelength $\lambda_{DFB}$ ($\Delta\lambda=\lambda_{DFB}-\lambda_{PL}$) should be strictly controlled in a specified range for obtaining excellent lasing characteristics. $\Delta\lambda$ refers to a detuning amount.

The semiconductor laser devices are divided into the two types, one of which is an n-type device and the other is a p-type device depending on the conductivity of the semiconductor substrate. The p-type device having the layer structure on the p-type semiconductor substrate is frequently used because of the controllability of the driving circuit.

However, the light emitting strength of the p-type device is weaker due to absorption of n-type cladding layer, and the measurement of the photoluminescence wavelength $\lambda_{PL}$ which is necessary for the strict control of the detuning of the DFB laser is difficult.

On the other hand, the light emitting strength sufficient for the measurement of the photoluminescence wavelength $\Delta_{PL}$ can be obtained in the n-type device. Accordingly, for the smooth evaluation of the photoluminescence wavelength $\lambda_{PL}$ in the DFB laser, the layer structure having the active layer on the n-type semiconductor substrate is frequently used.

The structure of the DFB laser includes two types. One structure forms the diffraction grating over the active layer or opposite to the semiconductor substrate (hereinafter referred to as "upper diffraction grating type"), and the other forms the diffraction grating below the active layer or between the semiconductor substrate and the active layer (hereinafter referred to as "lower diffraction grating type").

In the structure including the n-type semiconductor substrate and the upper diffraction grating type, the detuning controllability is excellent because the cycle $\Lambda$ of the diffraction grating can be established after the photoluminescence wavelength $\lambda_{PL}$ of the active layer is measured.

On the other hand, the structure of the lower diffraction grating type has an advantage that the growth of the buried diffraction grating and the growth of the active layer can be simultaneously carried out to decrease the growth operations by one operation compared with the upper diffraction grating type. However, the technical difficulty is accompanied because the bandgap wavelength of the active layer should be strictly controlled for the detuning control.

In the upper diffraction grating type structure formed on the n-type semiconductor substrate that is most advantageous for the detuning control, the device resistance is likely to increase because the diffraction grating is formed in a p-type cladding layer.

The reason of increasing the device resistance in the laser device is mainly the device resistance of the p-type semiconductor layer, which is explained by the low mobility of hole carrier. The formation of the layer such as the diffraction grating having the composition different from the p-type semiconductor layer increases the energy barrier for the injected carrier, thereby increasing the device resistance.

Further, in the upper diffraction grating type structure formed on the n-type semiconductor substrate, a problem arises that a differential device resistance (dV/dI) is difficult to be clamped in a higher current injection side than a threshold current. As a result, a further problem arises that the frequency characteristic of the laser device is deteriorated at the time of the modulation to generate the performance degradation such as the reduction of the cut-off frequency at the 3 dB region determining the upper limit of the modulation frequency.

SUMMARY OF THE INVENTION

It is an object of the present invention to provide a DFB laser with an n-type semiconductor substrate having a smaller threshold current and smaller device resistance, and further excellent frequency characteristics.

In a first aspect of the present invention (first invention), a DFB semiconductor laser device is provided which includes an n-type semiconductor substrate, a layer structure formed on the semiconductor substrate and constituting a resonant cavity, the layer structure including an active layer and a diffraction grating overlying said active layer, and p-side and n-side electrodes sandwiching therebetween the semiconductor substrate and the layer structure, wherein a product of R×L is equal to or less than 2.5, and given R and L are a device resistance measured between the p-side electrode and the n-side electrode, and a cavity length of the resonant cavity, respectively.

In a second aspect of the present invention (second invention), a DFB semiconductor laser device is provided which includes an n-type semiconductor substrate, a layer structure formed on the semiconductor substrate and constituting a resonant cavity, the layer structure including an active layer and a diffraction grating overlying the active layer; and p-side and n-side electrodes sandwiching therebetween the semiconductor substrate and the layer structure, wherein a differential device resistance dV/dI defined by an injection current (I) injected from the p-side electrode and an applied voltage (V) applied between the p-side electrode and the n-side electrode satisfies the following relationship:

$$dV/dI(I_1=Ith+10\ mA)-dV/dI(I2=200\ mA) \leq 0.2 \times dV/dI$$
$$(I_1=Ith+10\ mA),$$

wherein Ith is a threshold current of the DFB laser device for resonance thereof, $dV/dI(I_1=Ith+10\ mA)$ is a first differential device resistance measured at an injection current of $I_1=Ith+10$ mA, and $dV/dI(I_2=200\ mA)$ is a second differential device resistance measured at an injection current of $I_2=200$ mA.

In a third aspect of the present invention (third invention), a DFB semiconductor laser device is provided which includes an n-type semiconductor substrate, and a layer structure, overlying the semiconductor substrate, including an active layer, a compound semiconductor layer constituting a diffraction grating and overlying the active layer, and an embedding layer embedding the diffraction grating, said at least one of the compound semiconductor layer and the embedding layer having a carrier density of $7 \times 10^{17}$ to $2 \times 10^{18}$ cm$^{-3}$.

In accordance with the first to third inventions, the DFB semiconductor laser device can be realized which includes at least one of the improvements of the 3 db region of the frequency response characteristic and the lasing characteristic at the higher temperature operation.

The above and other objects, features and advantages of the present invention will be more apparent from the following description.

PREFERRED EMBODIMENTS OF THE INVENTION

The present inventors have conceived as follows during the research for overcoming the above problems.

In order to decrease the device resistance, the increase of the carrier density of the P-type semiconductor layer is effective, especially the carrier densities of the compound semiconductor layer constituting the diffraction grating (hereinafter also referred to as "diffraction grating layer") and the embedding layer of the diffraction grating. However, the excessive increase of the carrier density increases the optical loss to arise a problem of the performance reduction of the threshold current and the initial slope efficiency. The initial slope efficiency refers to the inclination of an optical power-injection current curve at the optical power of about 10 mW.

The present inventors conducted the following experiment for investigating the carrier density dependencies of the threshold current and the device resistance with the idea that specified regions of the carrier densities of the diffraction grating layer and the embedding layer may exist in which all of the device resistance, the threshold current and the initial slope efficiency are satisfactory.

Figure 1:
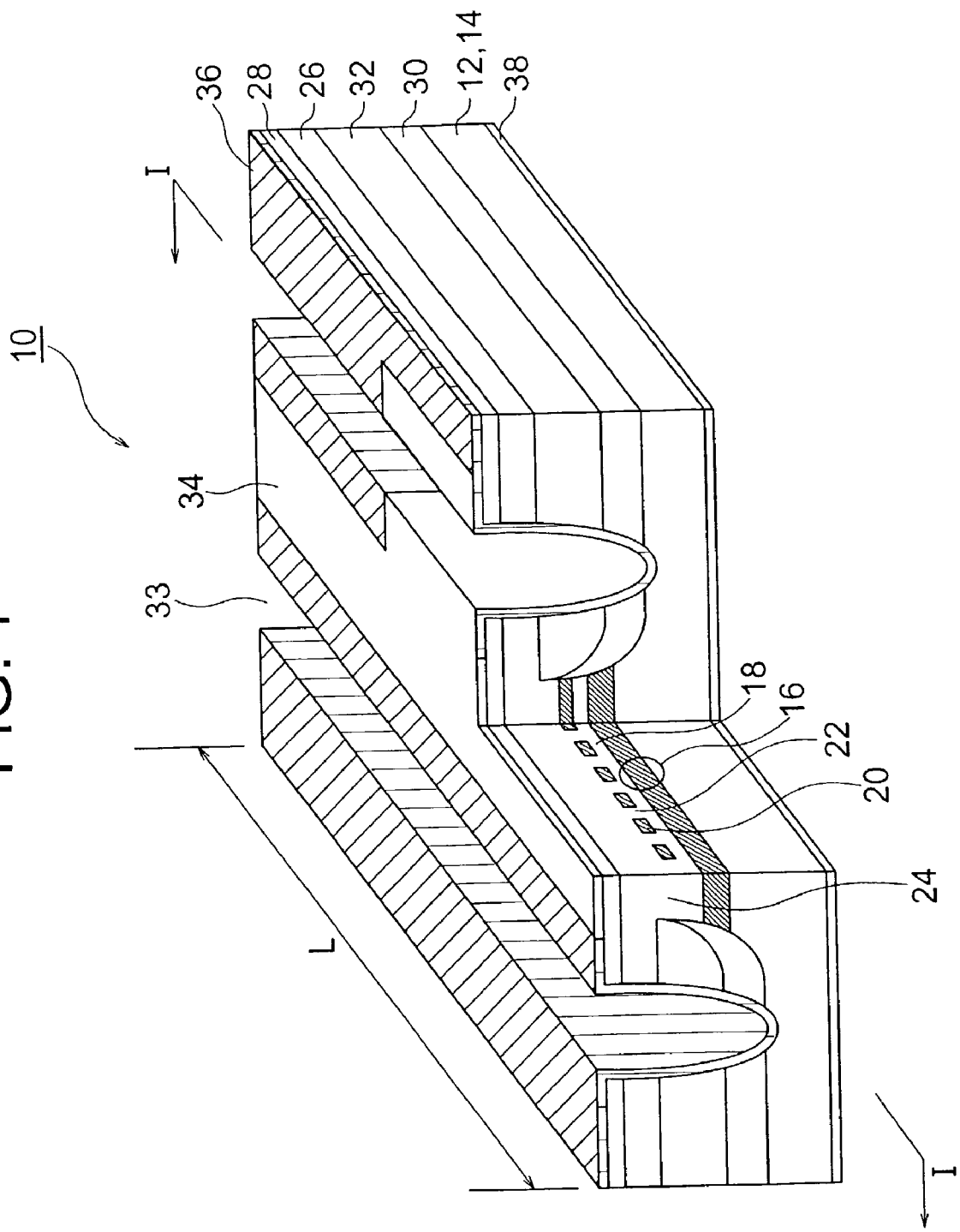
FIG. 1 is a partially broken perspective view showing a DFB laser used in an experiment.

As shown in FIG. 1, a DFB laser 10 used in the experiment is a buried hetero (BH) type DFB laser having a cavity length of 300 μm and a lasing wavelength of 1550 nm, and includes a layer structure on an n-InP semiconductor substrate 12 having thickness of about 350 μm. The layer structure includes an n-InP buffer layer 14, an MQW-SCH active layer 16, a P-InP spacer layer 18 having thickness of about 200 nm, a p-InP embedding layer 22 having therein buried InGaAsP-diffraction gratings 20, and a p-InP top cladding layer 24.

Figure 2:
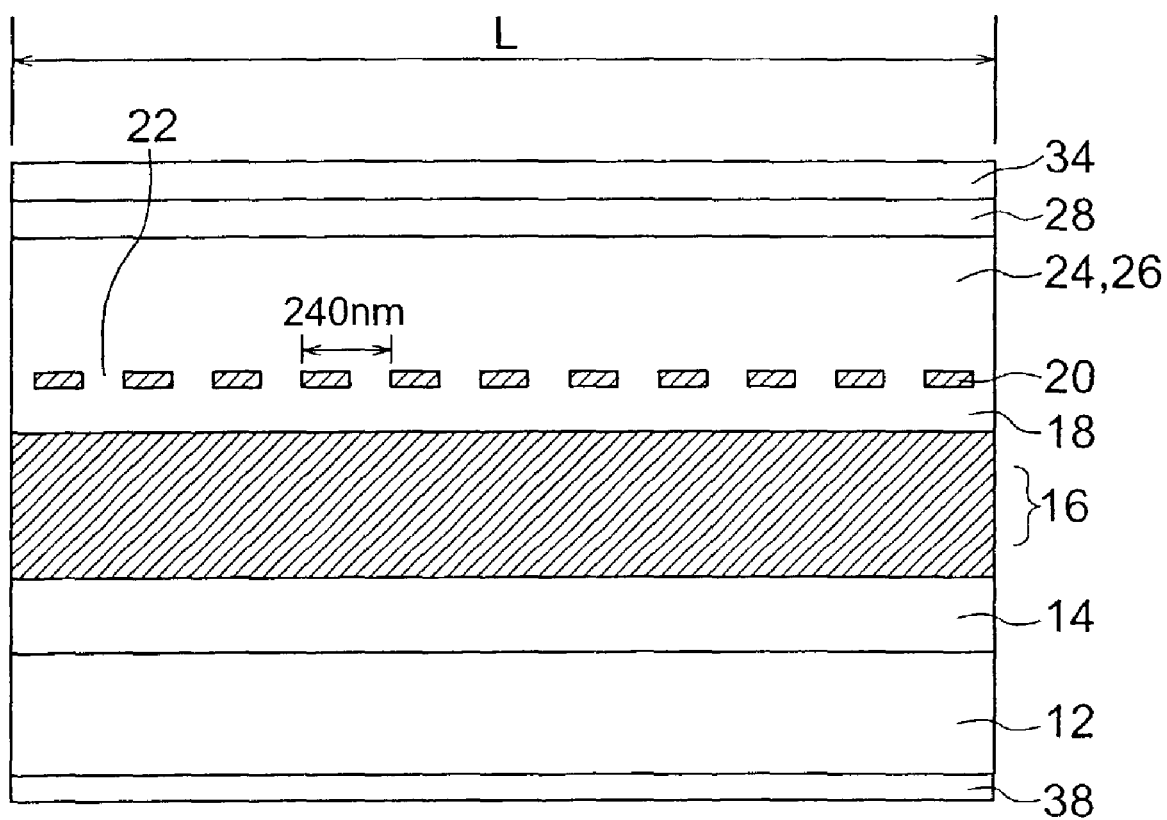
FIG. 2 is a sectional view of the DFB laser of FIG. 1 taken along a line I—I.

The bandgap of the MQW-SCH active layer 16 is 1550 nm when converted into the wavelength. The thickness of the diffraction grating layer is about 20 nm. As shown in FIG. 2, the cycle of the diffraction gratings 20 is about 240 nm and the duty ratio is about 30%.

In the layer structure, the p-InP top cladding layer 24, the p-InP embedding layer 22, the InGaAsP-diffraction gratings 20, the P-InP spacer layer 18, the MQW-SCH active layer 16 and the upper part of the n-InP buffer layer 14 are configured to be mesa-striped such that the MQW-SCH active layer 16 has width of about 1.5 μm. The mesa stripe is sandwiched by a pair of stacked current blocking layers each including a p-InP layer 30 and an n-InP layer 32.

Although the waveguide structure in the resonator is not restricted to the BH structure, the optimization of the carrier density is effectively conducted in the BH structure in which the region including the diffraction grating always serves as current path.

A p-InP cladding layer 26 and a highly doped InGaAs contact layer 28 having thickness of 2 μm are sequentially deposited on the p-InP cladding layer 24 and the n-InP layers 32 existing on both sides of the cladding layer 24.

A dielectric film 36 and a p-side electrode 34 are formed on the doped InGaAs contact layer 28. The p-side electrode 34 is a Ti/Pt/Au stacked metal film. An AuGeNi film acting as an n-side electrode 38 is formed on the rear surface of the n-InP semiconductor substrate 12.

In order to reduce the parasitic capacitance, trenches 33 are horizontally formed through the doped InGaAs contact layer 28, the p-InP cladding layer 26 and the current blocking layer including the p-InP layer 30 and the n-InP layer 32.

A non-reflection coating film (not shown) and a high refection coating film (not shown) are formed on the front facet (outgoing facet) and the rear facet, respectively, of the DFB laser 10.

For the manufacture of the test DFB laser 10, the n-InP buffer layer 14, the MQW-SCH active layer 16, the P-InP spacer layer 18 and the layer for forming the diffraction gratings 20 were sequentially formed on the n-InP semiconductor substrate 12 by using an MOCVD apparatus at growing temperature of 600° C.

Then, after resist for electron beam (EB) depicting having thickness of about 100 nm was deposited on the layer for forming the diffraction gratings 20, a resist film having diffraction grating pattern with a cycle of about 240 nm was formed by using an EB lithography apparatus. The InGaAsP diffraction gratings 20 were formed by etching the resist film and the layer for forming the diffraction gratings by using a dry etching apparatus.

Figure 3:
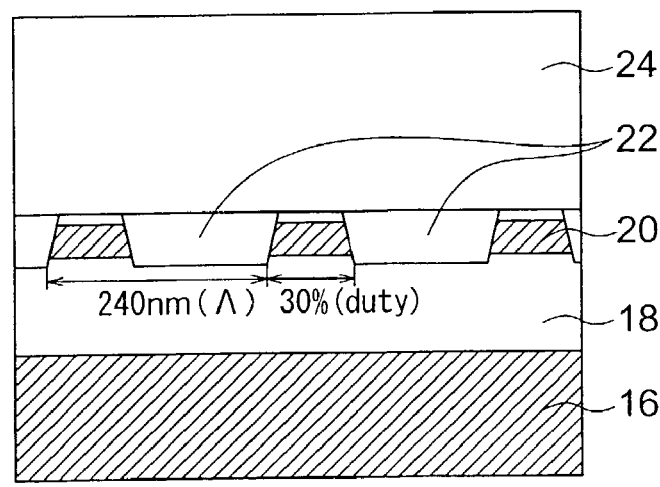
FIG. 3 is an enlarged sectional view showing the diffraction grating of the DFB laser of FIG. 1.
Figure 4:
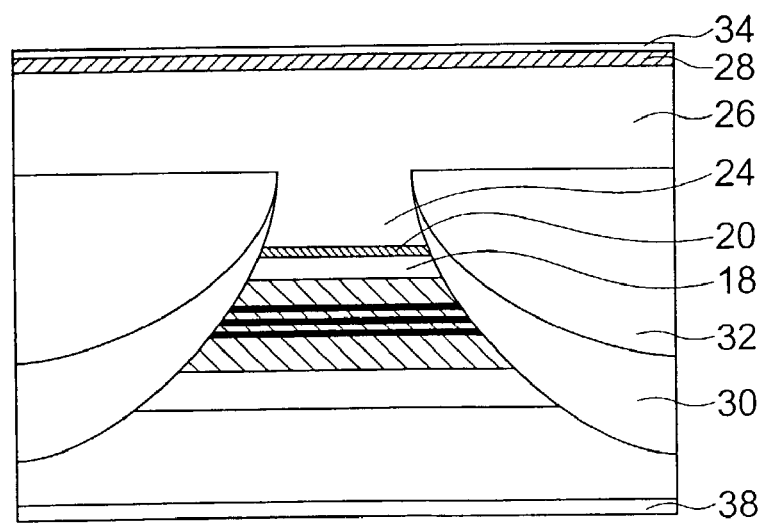
FIG. 4 is a sectional view showing a central section perpendicular to the direction of the resonator of the DFB laser.

Then, after the temperature was lowered to 520° C. for preventing the thermal deformation of the InGaAsP diffraction grating 20, the p-InP embedding layer 22 and the p-InP cladding layer 24 were grown to conduct the filling and the re-growing of the InGaAsP diffraction gratings 20 by using the MOCVD apparatus, as shown in FIG. 3.

After the formation of an $SiN_x$ film on the entire surface of the wafer, the $SiN_x$ film was etched to form an $SiN_x$ film mask (not shown) by using photolithography and a reactive ion etching (RIE) method such that stripes having width of 4 μm extend in a direction parallel to the cycles of the diffraction gratings 20.

Then, by using the striped $SiN_x$ film mask as an etching mask, the p-InP top cladding layer 24, the p-InP embedding layer 22, the InGaAsP-diffraction gratings 20, the P-InP spacer layer 18, the MQW-SCH active layer 16 and the upper part of the n-InP buffer layer 14 were etched to obtain a mesa stripe with the MQW-SCH active layer 16 having width of about 1.5 μm.

Then, by using the $SiN_x$ film mask as a selective growth mask, the p-InP layer 30 and the n-InP layer 32 were sequentially and selectively grown to fill the both sides of the mesa stripe, thereby forming the current (carrier) blocking layer.

After the removal of the $SiN_x$ film mask, the p-InP cladding layer 26 and the highly doped InGaAs contact layer 28 having thickness of about 2 μm were grown.

Then, the n-InP layer 32 and the p-InP layer 30 were etched to form the trenches 30, and the dielectric film 36 was formed on the entire surface of the wafer.

After the partial opening of the dielectric film, the Ti/Pt/Au stacked metal film acting as the p-side electrode 34 was deposited in the form of a pad on the highly doped InGaAs contact layer 28 and the dielectric film 36.

After the rear surface of the n-InP semiconductor substrate was polished such that thickness of the semiconductor substrate was adjusted to be about 120 μm, the AuGeNi film acting as the n-side electrode 38 was formed. After the formation of the non-reflection coating film and the high refection coating film on the front facet and the rear facet, respectively, of the DFB laser 10, the wafer was chipped and bonded.

In the present experiment, the carrier density, the threshold current (Ith) and the device resistance (R) were measured after a large number of the test DFB lasers were fabricated which had different carrier densities from $2 \times 10^{17}$ to $5 \times 10^{18}$ cm$^{-3}$ in their InGaAsP diffraction gratings 20 and the p-InP embedding layers 22, by controlling the amounts of raw material gas for the p-type dopant. The device resistance refers to the electric resistance between the p-side electrode and the n-side electrode.

TABLE

| In case of L = 300 μm | | |
|---|---|---|
| Carrier Density [cm$^{-3}$] | Ith [mA] | Resistance [Ω] |
| $2 \times 10^{17}$ | 8.5 | 9.25 |
| $3 \times 10^{17}$ | 8.5 | 8.25 |
| $4 \times 10^{17}$ | 8.5 | 7.25 |
| $5 \times 10^{17}$ | 8.5 | 6.5 |
| $6 \times 10^{17}$ | 8.5 | 5.75 |
| $7 \times 10^{17}$ | 8.5 | 5.25 |
| $8 \times 10^{17}$ | 8.5 | 5 |
| $9 \times 10^{17}$ | 8.5 | 5 |
| $1 \times 10^{18}$ | 8.5 | 5 |
| $2 \times 10^{18}$ | 9.35 | 4.75 |
| $3 \times 10^{18}$ | 12.75 | 4.75 |
| $4 \times 10^{18}$ | 21.25 | 4.75 |
| $5 \times 10^{18}$ | 29.75 | 4.75 |

Figure 5:
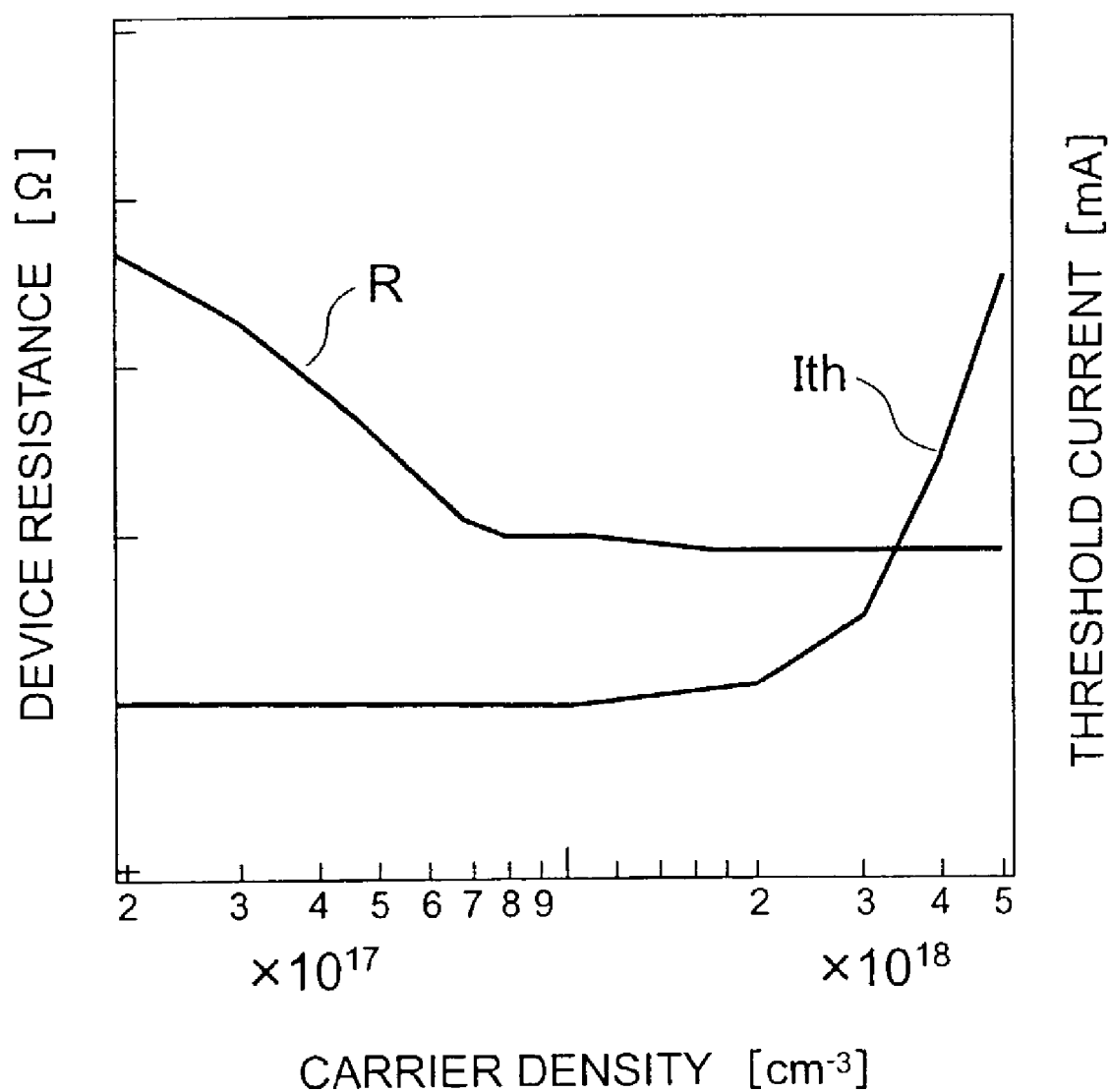
FIG. 5 is a graph showing the relations between a carrier density and threshold current (Ith) and between the carrier density and device resistance (R) in the experiment.

The experiment results are shown in a graph of FIG. 5, wherein the relations between the carrier density and the threshold current (Ith) and between the carrier density and the device resistance (R) are shown.

As apparent from FIG. 5, the threshold current was nearly stable in the carrier density region from $2 \times 10^{17}$ to $2 \times 10^{18}$ cm$^{-3}$, and increased beyond $2 \times 10^{18}$ cm$^{-3}$. The device resistance (R) decreased in the carrier density region from $2 \times 10^{17}$ to $7 \times 10^{17}$ cm$^{-3}$, and nearly stable from $7 \times 10^{17}$ to $5 \times 10^{18}$ cm$^{-3}$.

Figure 6:
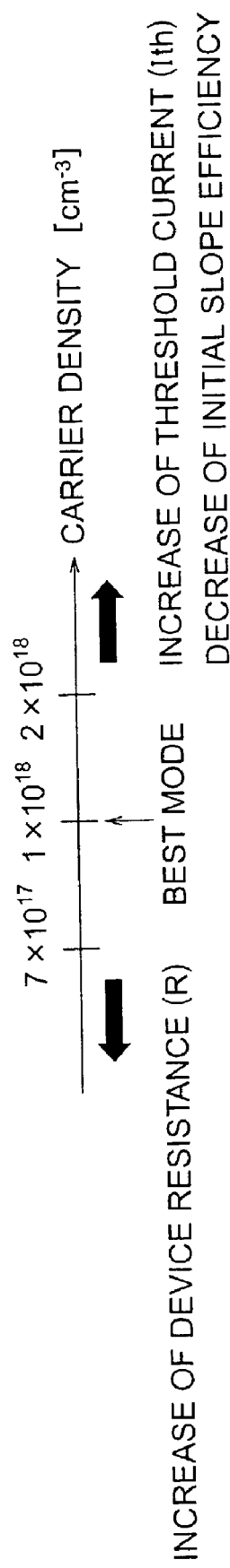
FIG. 6 is a conceptual diagram showing the experiment results.

FIG. 6 is a conceptual diagram showing the experiment results. As shown in the diagram, the device resistance (R) and the threshold current (Ith) can be made smaller when the carrier density is controlled in the range from $7 \times 10^{17}$ to $2 \times 10^{18}$ cm$^{-3}$. The carrier density around $1 \times 10^{18}$ cm$^{-3}$ is the best mode.

Based on the experimental results, the first to third inventions have been made.

When, in the third invention, the carrier densities of both of the compound semiconductor layer constituting the diffraction grating and the embedding layer are below $7 \times 10^{17}$ cm$^{-3}$, the device resistance increases. When the carrier densities exceed $2 \times 10^{18}$ cm$^{-3}$, the threshold current increases.

Suitably, the carrier density of at least one of the compound semiconductor layer and the embedding layer is from $9 \times 10^{17}$ to $1 \times 10^{18}$ cm$^{-3}$. As shown in FIG. 5, the carrier density below $9 \times 10^{17}$ cm$^{-3}$ somewhat increases the device resistance (Ω), and the carrier density over $1 \times 10^{18}$ cm$^{-3}$ somewhat increases the threshold current (Ith).

Both of the carrier densities of the compound semiconductor layer and the embedding layer are preferably in the range specified in the third invention for realizing the effects of the present invention.

When the carrier density is established in the higher density region over $2 \times 10^{18}$ cm$^{-3}$, the diffraction grating should be apart from the active layer because the dopant diffusion to the active layer is not preferable for the laser performance. In order to obtain the lower threshold current characteristic, the reasonable strength of the diffraction grating should be maintained.

Figure 9:
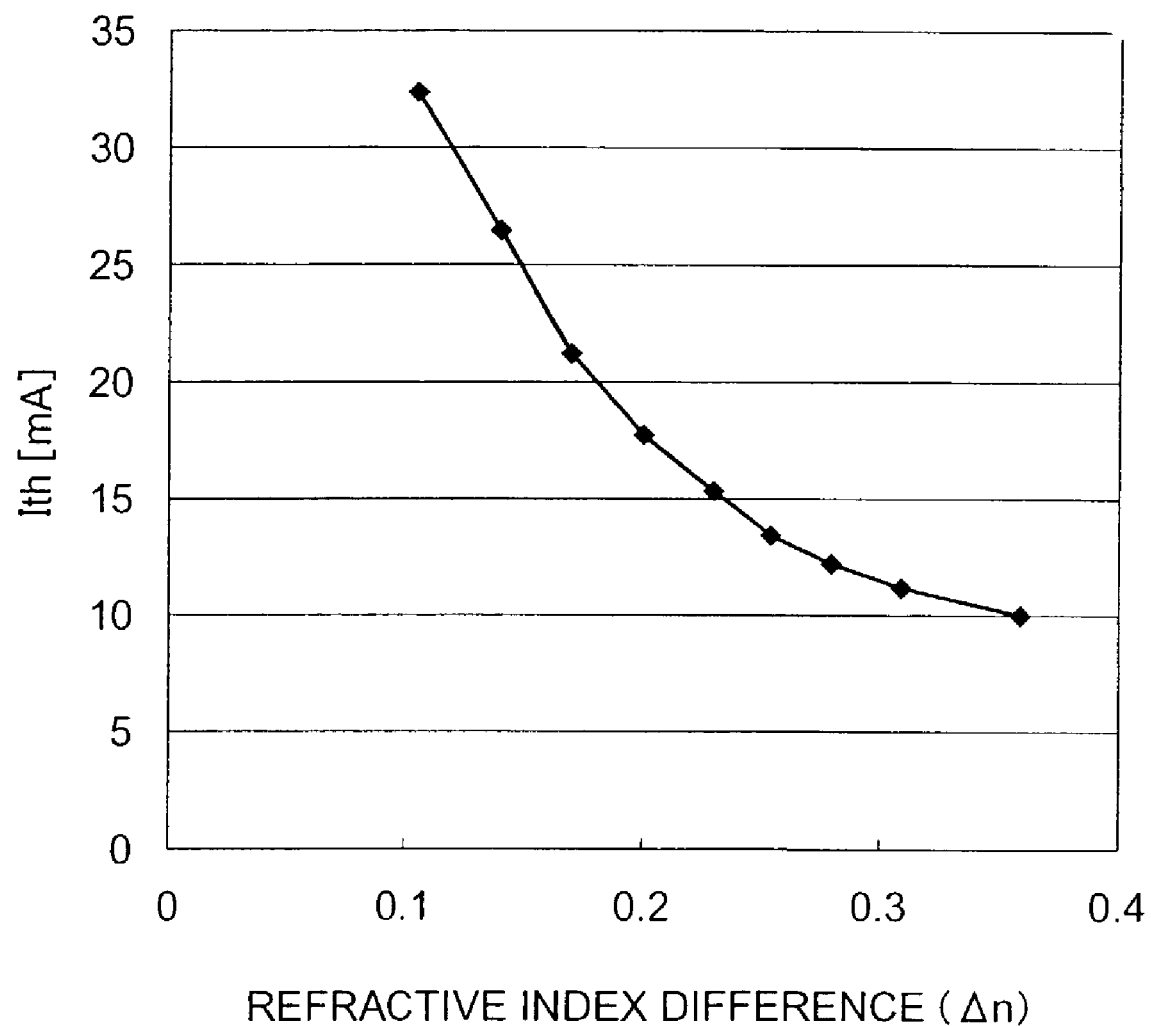
FIG. 9 is a graph showing the relation between threshold current and a difference between refractive indices.

Therefore, it is required to obtain the reasonable distribution feedback with the diffraction grating by increasing the refractive index difference (bandgap difference) between the compound semiconductor layer and the embedding layer. As apparent from the graph of FIG. 9 showing the relation between the refractive index difference (Δn) between the compound semiconductor layer and the embedding layer, and the lasing threshold current (Ith,[mA]), it is preferable that the refractive index difference is at least 0.15 or more, and the bandgap difference is 0.2 μm or more, because the graph of FIG. 9 shows that the lasing threshold current (Ith) rapidly increases when the refractive index difference (Δn) is below 0.15.

In the first invention, the product R (device resistance)·L (cavity length) [Ω·m] is $2.5 \times 10^{-3}$ [Ω·m] or less. The product (R·L) over the $2.5 \times 10^{-3}$ [Ω·m] deteriorates the frequency response characteristic and the lasing characteristic at the higher temperature operation.

In the first to third inventions, the 3 dB region of the frequency response characteristic is 10 GHz or more in the entire temperature range from −40° C. to +85° C.

Then, the configurations of DFB laser devices in accordance with embodiments of the present invention will be described referring to the annexed drawings.

Embodiment 1

Figure 7:
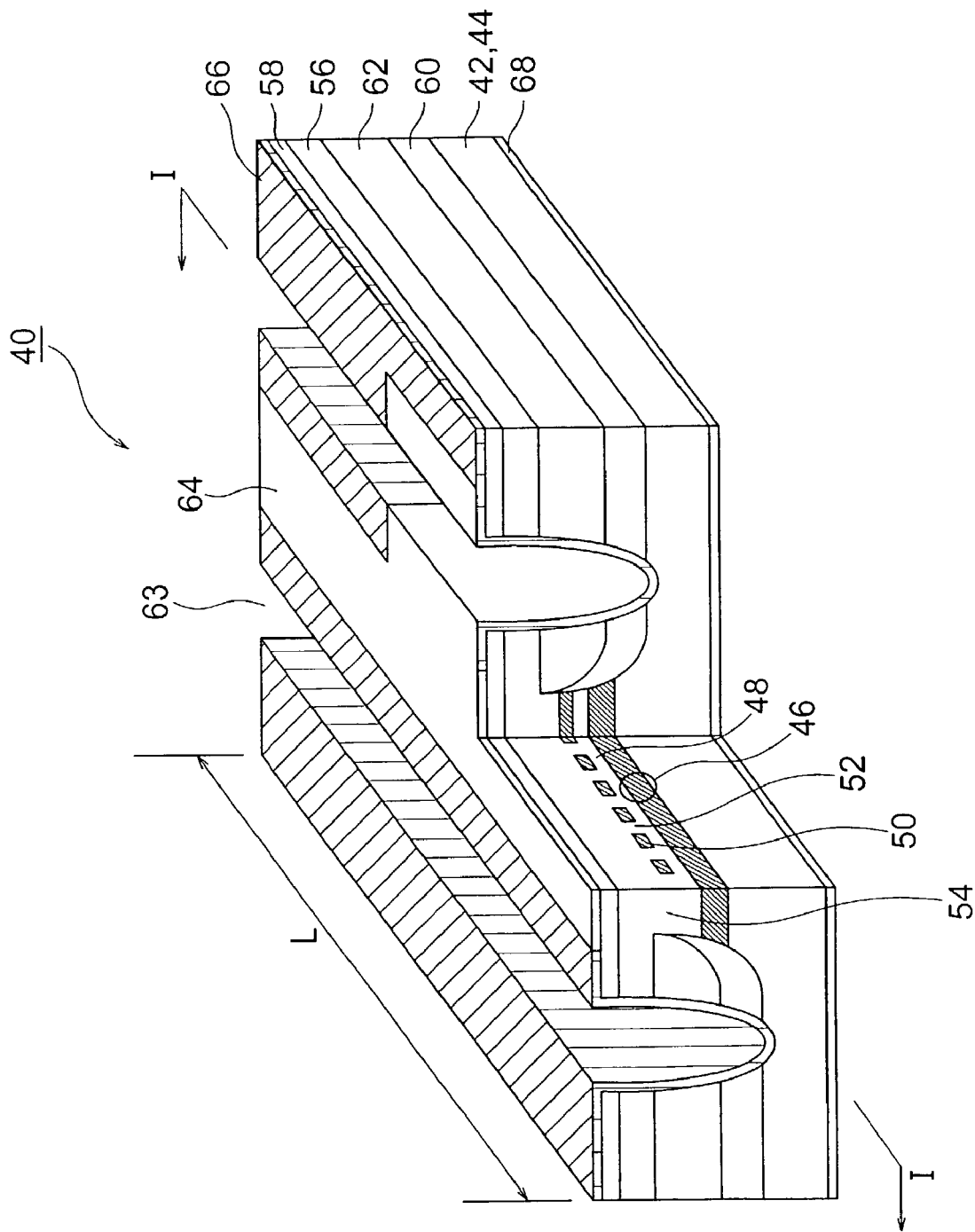
FIG. 7 is a partially broken perspective view showing a DFB laser in accordance with Embodiment 1.

As shown in FIG. 7, a DFB laser 40 includes substantially the same configuration as the above test DFB laser 10 except that the carrier densities of InGaAsP diffraction gratings 50 and a p-InP embedding layer 52 are $1 \times 10^{18}$ cm$^{-3}$.

The DFB laser 40 is a BH type DFB laser having a cavity length (L) of 300 μm and a lasing wavelength of 1550 nm, and includes a layer structure on an n-InP semiconductor substrate 42 having thickness of about 350 μm. The layer structure includes an n-InP buffer layer 44, an MQW-SCH active layer 46, a P-InP spacer layer 48 having thickness of about 200 nm, the p-InP embedding layer 52 having therein the buried InGaAsP-diffraction gratings 50, and a p-InP top cladding layer 54.

The bandgap of the MQW-SCH active layer 46 is 1550 nm when converted into the wavelength. The thickness of the diffraction grating layer is about 20 nm. The cycle of the diffraction grating 20 is about 240 nm and the duty ratio is about 30%. The carrier density of the InGaAsP layer constituting the diffraction gratings 50 is adjusted to be $1 \times 10^{18}$ cm$^{-3}$.

The carrier density of the p-InP embedding layer 52 for filling the space among the etched diffraction gratings 50 is also adjusted to be $1 \times 10^{18}$ cm$^{-3}$.

In the layer structure, the p-InP top cladding layer 54, the p-InP embedding layer 52, the InGaAsP-diffraction gratings 50, the P-InP spacer layer 48, the MQW-SCH active layer 46 and the upper part of the n-InP buffer layer 44 are configured to be mesa-striped such that the MQW-SCH active layer 46 has width of about 1.5 μm. The mesa stripe is sandwiched by a pair of stacked current (carrier) blocking layers each including a p-InP layer 60 and an n-InP layer 62.

A p-InP cladding layer 56 and a highly doped InGaAs contact layer 58 having thickness of 2 μm are sequentially deposited on the p-InP cladding layer 54 and the n-InP layers 52 existing on both sides of the cladding layer 54.

A dielectric film 56 is formed on the entire doped InGaAs contact layer 58 except a stripe-shaped surface on which a part of Ti/Pt/Au stacked metal film acting as a p-side electrode is formed. An AuGeNi film acting as an n-side electrode 68 is formed on the rear surface of the n-InP semiconductor substrate 42.

In order to reduce the parasitic capacitance, trenches 63 are horizontally formed through the current (carrier) blocking layer including the p-InP layer 60 and the n-InP layer 62.

A non-reflection coating film (not shown) and a high refection coating film (not shown) are formed on the front facet (outgoing facet) and the rear facet, respectively, of the DFB laser 40.

The DFB laser 40 of the present embodiment can be fabricated similarly to the test DFB laser 10.

Then, for evaluating the DFB laser 40 of the present embodiment, 100 test DFB lasers were fabricated and several measurements were conducted by using these test DFB lasers.

The standard deviation of the device resistance (R) was 0.32 Ω, and the average resistance was 5 Ω. Accordingly, the product R·L [Ω·m] is $5 \times 300 \times 10^{-6} = 1.5 \times 10^{-3}$ [Ω·m] that is lower than $2.5 \times 10^{-3}$ [Ω·m].

The standard deviation of the threshold current was 0.65 mA. The average threshold current was 8.5 mA, that is nearly equivalent to 9 mA, that of a conventional DFB laser.

The value of the differential device resistance dV/dI (@Ith+10 mA) was 5 Ω when the injection current was larger than the threshold current by 10 mA, and the value of the differential device resistance dV/dI (@200 mA) was 4.6 Ω when the injection current was 200 mA. The difference between the both values was small or within 10% of the differential device resistance dV/dI (@Ith+10 mA) when the injection current was larger than the threshold current by 10 mA.

The initial slope efficiency was 0.42 mW/mA that is nearly equivalent to 0.40 mW/mA of the average value of a conventional DFB laser.

The 3 dB region of the frequency response characteristic was 8 GHz or more in the entire temperature range from −40° C. to +85° C.

The DFB laser 40 of the present embodiment can be evaluated to be excellent in connection with the performance required for the uncooled DFB laser used for the WDW optical transmission system.

Embodiment 2

A DFB laser 80 of the present embodiment includes substantially the same configuration as the above DFB laser 40 except that the lasing wavelength is 1310 nm, the cavity length (L) is 300 μm and the waveguide is the ridge-type.

Figure 8:
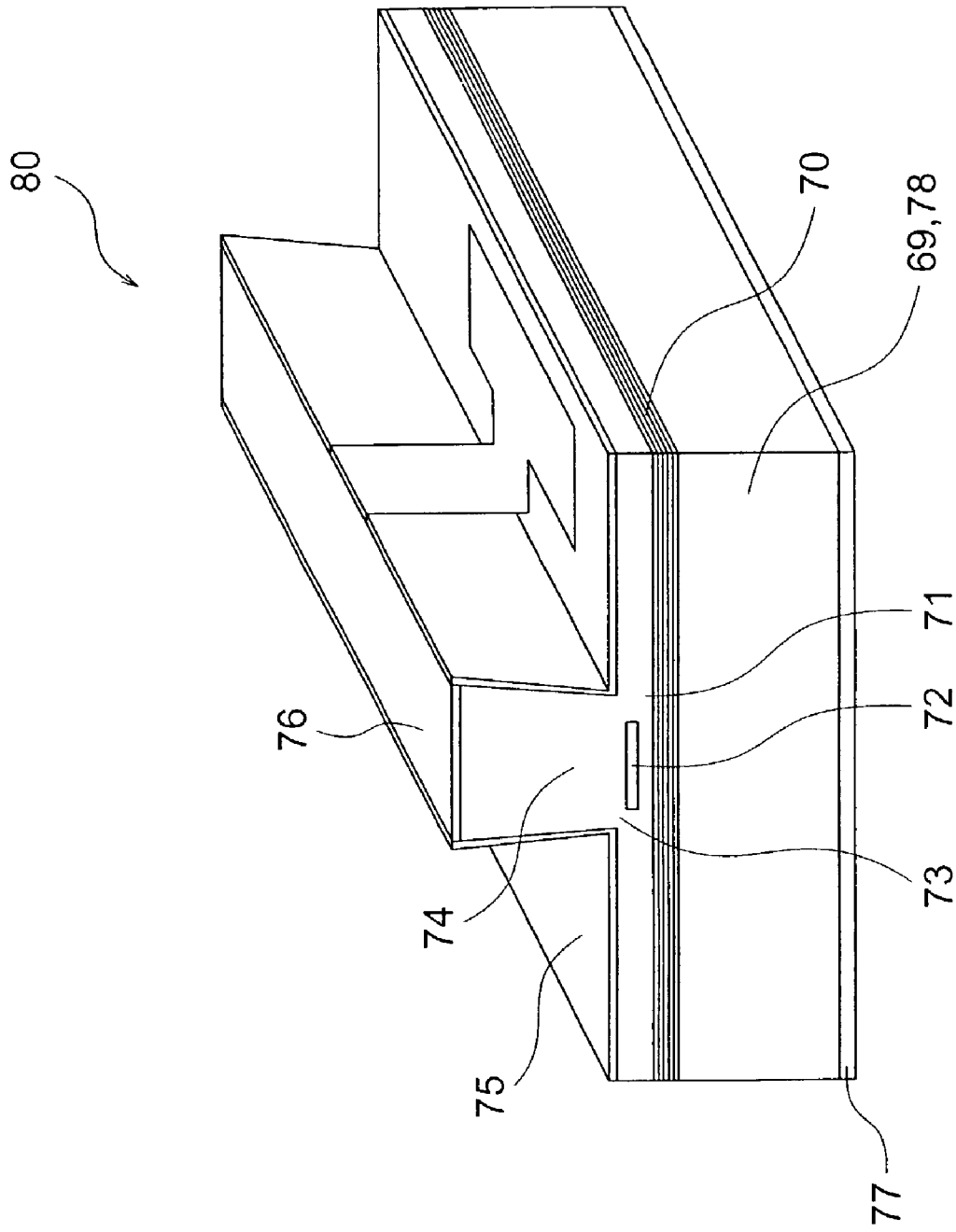
FIG. 8 is a perspective view showing a DFB laser in accordance with Embodiment 2.

As shown in FIG. 8, the DFB laser 80 has a layer structure, on an n-InP semiconductor substrate 78 having thickness of about 350 μm, including an n-InP buffer layer 69, an MQW-SCH active layer (InGaAsP) 70, a P-InP spacer layer 71, a p-InP embedding layer 73 having therein buried diffraction grating 72, and a p-InP cladding layer 74.

The material of the active layer is not restricted to the InGaAsP/InP, and AlGaInAs/InP can be used.

The bandgap of the MQW-SCH active layer 70 is 1335 nm when converted into the wavelength. The cycle of the diffraction grating 72 is about 200 nm and the duty ratio is about 30%.

The carrier densities of the compound semiconductor layer constituting the diffraction grating 72 and the embedding layer 73 are adjusted to be $1 \times 10^{18}$ cm$^{-3}$.

The P-InP cladding layer 74 in the layer structure is configured to be mesa-striped. On the mesa stripe, a dielectric film 75 is formed except a stripe-shaped surface on which a part of Ti/Pt/Au stacked metal film 76 acting as a p-side electrode is formed. An AuGeNi film acting as an n-side electrode 77 is formed on the rear surface of the n-InP semiconductor substrate 78.

Then, for evaluating the DFB laser 40 of the present embodiment, 100 DFB lasers were fabricated and several measurements were conducted by using these DFB lasers.

The standard deviation of the device resistance (R) was 0.25 Ω, and the average resistance was 6.5 106 . Accordingly, the product R·L [Ω·m] is $6.5 \times 300 \times 10^{-6} = 1.95 \times 10^{-3}$ [Ω·m] that is lower than $2.5 \times 10^{-3}$ [Ω·m].

The value of the differential device resistance dV/dI (@Ith+10 mA) was 6.5 Ω when the injection current was larger than the threshold current by 10 mA, and the value of the differential device resistance dV/dI (@200 mA) was 6.1 Ω when the injection current was 200 mA. The difference between the both values was about 6% sufficiently below 10% of the differential device resistance dV/dI (@Ith+10 mA) when the injection current was larger than the threshold current by 10 mA.

The standard deviation of the threshold current was 0.72 mA. The average threshold current was 5.3 mA.

The 3 dB region of the frequency response characteristic was 10 GHz or more in the entire temperature range from −40° C. to +85° C.

As mentioned above, the optimization of the carrier densities of the compound semiconductor layer constituting the diffraction grating and the embedding layer around the diffraction grating in the DFB laser can generate the higher modulation characteristic of the 3 dB region regardless of the structure of the waveguide.

Since the above embodiment is described only for examples, the present invention is not limited to the above embodiment and various modifications or alterations can be easily made therefrom by those skilled in the art without departing from the scope of the present invention.

What is claimed is:

1. A distributed feedback (DFB) semiconductor laser device comprising:
   an n-type semiconductor substrate; and
   a layer structure, overlying the semiconductor substrate, including an active layer,
   a p-type spacer layer overlying the active layer,
   a p-type compound semiconductor layer constituting a diffraction grating and overlying the spacer layer,
   a p-type embedding layer embedding the diffraction grating, and
   a p-type cladding layer overlying the compound semiconductor layer and the embedding layer,
   wherein said at least one of the compound semiconductor layer and the embedding layer have a carrier density which is greater than a carrier density of the spacer layer and the cladding layer, and which is in the range of $7 \times 10^{17}$ to $2 \times 10^{18}$ cm$^{-3}$.

2. The DFB semiconductor laser device as defined in claim 1, wherein said at least one of the p-type compound semiconductor layer and the embedding layer has a carrier density of $9 \times 10^{17}$ to $1 \times 10^{18}$ cm$^{-3}$.

3. The DFB semiconductor laser device as defined in claim 1, wherein a product (R·L) between a device resistance "R" (Ω) and a cavity length "L" (m) of the DFB semiconductor laser device is equal to or less than $2.5 \times 10^{-3}$ [Ω·m].

4. The DFB semiconductor laser device as defined in claim 1, wherein a differential device resistance dV/dI defined by an injection current (I) injected from a p-side electrode and an applied voltage (V) applied between the p-side electrode and an n-side electrode satisfies the following relationship:

$$dV/dI(I_1=Ith+10 \text{ mA}) - dV/dI(I_2=200 \text{ mA}) \leq 0.2 \times dV/dI(I_1=Ith+10 \text{ mA}),$$

wherein Ith is a threshold current of the DFB laser device for resonance thereof, $dV/dI(I_1=Ith+10$ mA) is a first differential device resistance measured at an injection current of $I_1=Ith+10$ mA, and $dV/dI(I_2=200$ mA) is a second differential device resistance measured at an injection current of $I_2=200$ mA.

5. The DFB semiconductor laser device as defined in claim 1, wherein 3 dB region of a frequency response characteristic is 5 GHz or more.

6. The DFB semiconductor laser device as defined in claim 1, wherein a difference between refractive indices of the p-type compound semiconductor layer constituting the diffraction grating and the embedding layer is 0.15 or more.

7. The DFB semiconductor laser device as defined in claim 1, wherein a difference between bandgap wavelengths of the p-type compound semiconductor layer constituting the diffraction grating and the embedding layer is 0.2 μm or more.

8. The DFB semiconductor laser device as defined in claim 1, wherein a waveguide structure is a buried hetero (BH) structure.

* * * * *